United States Patent
Nakao

(10) Patent No.: US 11,179,936 B2
(45) Date of Patent: Nov. 23, 2021

(54) LIQUID EJECTING HEAD, LIQUID EJECTING APPARATUS, AND PIEZOELECTRIC DEVICE

(71) Applicant: SEIKO EPSON CORPORATION, Tokyo (JP)

(72) Inventor: Hajime Nakao, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 571 days.

(21) Appl. No.: 16/129,582

(22) Filed: Sep. 12, 2018

(65) Prior Publication Data

US 2019/0077152 A1 Mar. 14, 2019

(30) Foreign Application Priority Data

Sep. 13, 2017 (JP) .............................. JP2017-175475
Jan. 29, 2018 (JP) .............................. JP2018-012273

(51) Int. Cl.
| | |
|---|---|
| *B41J 2/14* | (2006.01) |
| *H01L 41/053* | (2006.01) |
| *H01L 41/09* | (2006.01) |
| *H01L 41/04* | (2006.01) |
| *H01L 41/08* | (2006.01) |
| *H01L 41/047* | (2006.01) |

(52) U.S. Cl.
CPC ......... *B41J 2/14233* (2013.01); *B41J 2/1433* (2013.01); *H01L 41/042* (2013.01); *H01L 41/0471* (2013.01); *H01L 41/053* (2013.01); *H01L 41/0815* (2013.01); *H01L 41/09* (2013.01); *B41J 2002/14241* (2013.01); *B41J 2002/14362* (2013.01); *B41J 2002/14419* (2013.01); *B41J 2002/14491* (2013.01)

(58) Field of Classification Search
None
See application file for complete search history.

(56) References Cited

U.S. PATENT DOCUMENTS

| | | | |
|---|---|---|---|
| 2006/0055742 A1* | 3/2006 | Yokouchi | ............. B41J 2/14233 347/68 |
| 2012/0069095 A1 | 3/2012 | Kida et al. | |
| 2015/0328896 A1* | 11/2015 | Kato | ...................... B41J 2/1631 438/21 |

FOREIGN PATENT DOCUMENTS

| | | |
|---|---|---|
| JP | 2013119166 A | 6/2013 |
| JP | 2017-24334 A | 2/2017 |

OTHER PUBLICATIONS

European Search Report issued in Application No. 18194228 dated Jan. 22, 2019.

* cited by examiner

*Primary Examiner* — Erica S Lin
(74) *Attorney, Agent, or Firm* — Workman Nydegger

(57) ABSTRACT

A liquid ejecting head includes a flow path forming substrate, a vibration plate that is formed on one surface side of the flow path forming substrate, a first piezoelectric element that is provided on the vibration plate, a second piezoelectric element that is provided on the vibration plate, a protective substrate that is bonded to the one surface side of the flow path forming substrate, a flow path member that is adhered to a side of the protective substrate opposite to the flow path forming substrate via an adhesive, and a drive circuit that is mounted in a space formed so as to be surrounded by the flow path forming substrate, the protective substrate, and the flow path member, in which the flow path member is provided with a hole portion which is open to a region facing the space.

19 Claims, 11 Drawing Sheets

LIQUID EJECTING HEAD, LIQUID EJECTING APPARATUS, AND PIEZOELECTRIC DEVICE

The entire disclosure of Japanese Patent Application No. 2017-175475, filed Sep. 13, 2017 and 2018-012273, filed Jan. 29, 2018 are expressly incorporated by reference herein.

BACKGROUND

1. Technical Field

The present invention relates to a liquid ejecting head that ejects a liquid, a liquid ejecting apparatus including the liquid ejecting head, and a piezoelectric device including a piezoelectric element.

2. Related Art

An ink jet type recording head, which is a typical example of a liquid ejecting head, is provided with an individual flow path communicating with a nozzle, a flow path forming substrate provided with a liquid supply chamber communicating with the individual flow path, a piezoelectric element provided on one surface side of the flow path forming substrate via a vibration plate, a protective substrate fixed to a surface of the flow path forming substrate on the piezoelectric element side, and a flow path member provided on a side of the protective substrate opposite to the flow path forming substrate and has a flow path communicating with the liquid supply chamber (for example, refer to JP-A-2017-24334).

In such an ink jet type recording head, a drive circuit for driving the piezoelectric element is directly mounted on the flow path forming substrate.

However, if an adhesive for adhering a protective substrate and a flow path member flows out to a drive circuit side and a drive circuit and the flow path member are adhered to each other, a force acts in a direction where the drive circuit floats up toward the flow path member side due to curing shrinkage of the adhesive, so that there is a problem that mounting failure and migration of a mounting portion of the drive circuit are generated.

Such a problem is not limited to a liquid ejecting head represented by an ink jet type recording head, but also exists in a piezoelectric device.

SUMMARY

An advantage of some aspects of the invention is to provide a liquid ejecting head, a liquid ejecting apparatus, and a piezoelectric device in which mounting failure of a drive circuit are inhibited and reliability is improved.

According to an aspect of the invention, there is provided a liquid ejecting head including a nozzle plate on which a first nozzle row including a first nozzle ejecting a liquid and a second nozzle row including a second nozzle ejecting a liquid are formed, a flow path forming substrate on which a first pressure generation chamber communicating with the first nozzle and a second pressure generation chamber communicating with the second nozzle are formed, a vibration plate that is formed on one surface side of the flow path forming substrate, a first piezoelectric element that is provided on the vibration plate at a position corresponding to the first pressure generation chamber, a second piezoelectric element that is provided on the vibration plate at a position corresponding to the second pressure generation chamber, a protective substrate that is bonded to the one surface side of the flow path forming substrate, a flow path member that is adhered to a side of the protective substrate opposite to the flow path forming substrate via an adhesive, and in which a first flow path communicating with the first pressure generation chamber and a second flow path communicating with the second pressure generation chamber are formed, and a drive circuit that is mounted in a space formed so as to be surrounded by the flow path forming substrate, the protective substrate, and the flow path member, between the first piezoelectric element and the second piezoelectric element of the flow path forming substrate to drive the first piezoelectric element and the second piezoelectric element, in which the flow path member is provided with a hole portion which is open to a region facing the space.

In this case, by providing the hole portion in the flow path member, when the adhesive adhering the flow path member and the protective substrate protrudes, it is possible to inhibit the drive circuit and the flow path member from adhering to each other by allowing the protruded adhesive to flow out into the hole portion. Therefore, the drive circuit can be inhibited from floating up toward the flow path member due to curing shrinkage of the adhesive.

In the liquid ejecting head, it is preferable that the drive circuit be disposed in the space without being adhered to the flow path member. In this case, it is possible to inhibit the drive circuit from floating up on the flow path member side due to the curing shrinkage of the adhesive.

In the liquid ejecting head, it is preferable that the hole portion be a recessed portion provided in the flow path member. In this case, by forming the hole portion with the recessed portion, the drive circuit can be protected from the outside. In addition, by providing the hole portion including the recessed portion, it is possible to inhibit a decrease in the rigidity of the flow path member, and to inhibit a decrease in accuracy of the flow path member due to a decrease in rigidity. Therefore, it is unnecessary to improve the rigidity and accuracy of the flow path member, to easily control the protruding amount of the adhesive, and to widen the adhesion width, and it is possible to reduce the size of the flow path member.

In the liquid ejecting head, it is preferable that the hole portion be a through-hole penetrating the flow path member in a lamination direction of the flow path member and the protective substrate. In this case, by forming the hole portion as a through-hole, the space provided with the drive circuit can be opened to the atmosphere, the gas generated from a filler for mounting the drive circuit is discharged to the outside, and the gas is inhibited from moving toward a terminal portion side. In addition, it is possible to connect an external wiring to the drive circuit via the hole portion, and to easily arrange the wiring.

In the liquid ejecting head, it is preferable that an end portion of a side wall of the hole portion be located outside the drive circuit. In this case, even if the adhesive for adhering the flow path member to the protective substrate protrudes from the adhesive surface, the adhesive can flow into the hole portion before the protruded adhesive adheres to the drive circuit. In addition, even if the drive circuit is thicker than the protective substrate, adhesion of the protruded adhesive to the drive circuit can be inhibited.

In the liquid ejecting head, it is preferable that surface roughness of the side wall of the hole portion be larger than surface roughness of an adhesive surface to the protective substrate, to which the hole portion of the flow path member is open. In this case, it is easy to further guide the excessive adhesive to the side wall of the hole portion by the capillary force and it is possible to inhibit the excessive adhesive from protruding to an unexpected portion.

In the liquid ejecting head, it is preferable that the side wall of the hole portion be inclined so that an opening of the hole portion is widened toward the drive circuit with respect to the lamination direction of the flow path member and the protective substrate. In this case, the adhesive protruding from between the flow path member and the protective substrate is likely to flow into the hole portion along the inclined side wall and it is possible to further inhibit the excessive adhesive from adhering to the drive circuit or the like.

In the liquid ejecting head, it is preferable that a thickness of the drive circuit be thicker than that of the protective substrate. In this case, it is possible to improve the handling when mounting the drive circuit and to easily mount the drive circuit. In addition, since the drive circuit protrudes toward the flow path member side from the protective substrate, the drive circuit can be pressed with a tool larger than a top surface of the drive circuit when mounting the drive circuit, the uniformity of load and heating is improved, and the drive circuit can be stably mounted.

In the liquid ejecting head, it is preferable that in the flow path member, a portion where the first flow path is formed and adhered to the protective substrate be integrated with a portion where the second flow path is formed and adhered to the protective substrate. In this case, when the flow path member is adhered to the protective substrate, it is easy to uniformly apply a load to the adhesive surface, and the adhesion strength can be improved.

According to another aspect of the invention, there is provided a liquid ejecting apparatus including the above-described liquid ejecting head.

In this case, it is possible to realize the liquid ejecting apparatus in which the reliability of a mounting portion of the drive circuit is improved.

According to still another aspect of the invention, there is provided a piezoelectric device which is used in a liquid ejecting head, the device including a flow path forming substrate on which a first recessed portion and a second recessed portion are formed a vibration plate that is formed on one surface side of the flow path forming substrate a first piezoelectric element that is provided on the vibration plate at a position corresponding to the first recessed portion, a second piezoelectric element that is provided on the vibration plate at a position corresponding to the second recessed portion, a protective substrate that is bonded to the one surface side of the flow path forming substrate, a flow path member that is adhered to a side of the protective substrate opposite to the flow path forming substrate via an adhesive, and in which a first flow path communicating with the first recessed portion and a second flow path communicating with the second recessed portion are formed, and a drive circuit that is mounted in a space formed so as to be surrounded by the flow path forming substrate, the protective substrate, and the flow path member, between the first piezoelectric element and the second piezoelectric element of the flow path forming substrate to drive the first piezoelectric element and the second piezoelectric element, in which the flow path member is provided with a hole portion which is open to a region facing the space.

In this case, by providing the hole portion in the flow path member, when the adhesive adhering the flow path member and the protective substrate protrudes, it is possible to inhibit the drive circuit and the flow path member from adhering to each other by allowing the protruded adhesive to flow out into the hole portion. Therefore, the drive circuit can be inhibited from floating up toward the flow path member due to curing shrinkage of the adhesive.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
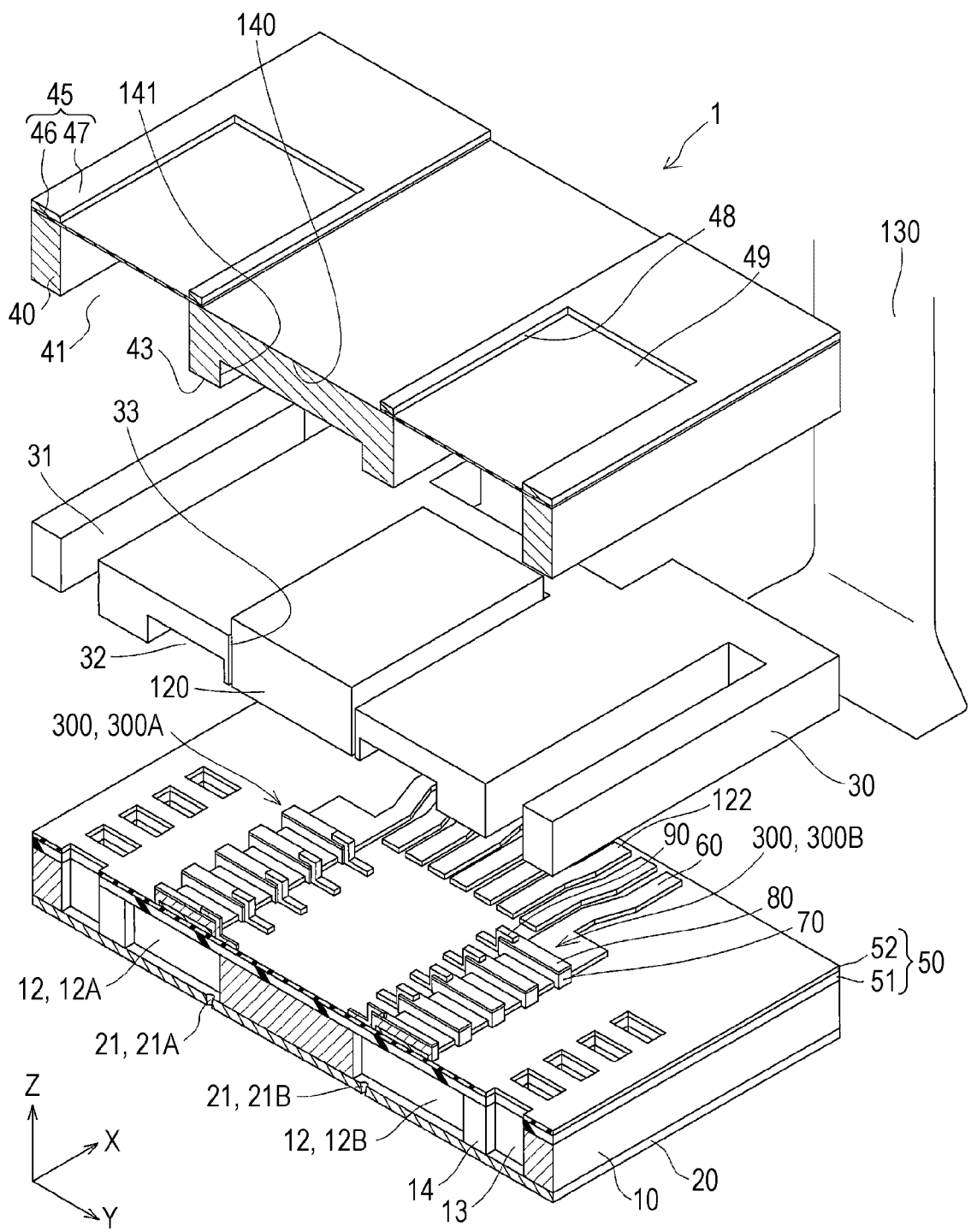
FIG. 1 is an exploded perspective view of a recording head according to Embodiment 1 of the invention.

Hereinafter, the invention will be described with reference to the drawings. However, the following description shows one embodiment of the invention, and it can be arbitrarily changed within the scope of the invention. In the drawings, the same reference numerals are given to the same members, and explanations thereof are omitted as appropriate. In addition, in each drawing, X, Y, and Z represent three spatial axes orthogonal to each other. In the specification, directions along these axes will be described as a first direction X, a second direction Y, and a third direction Z.

Embodiment 1

Figure 2:
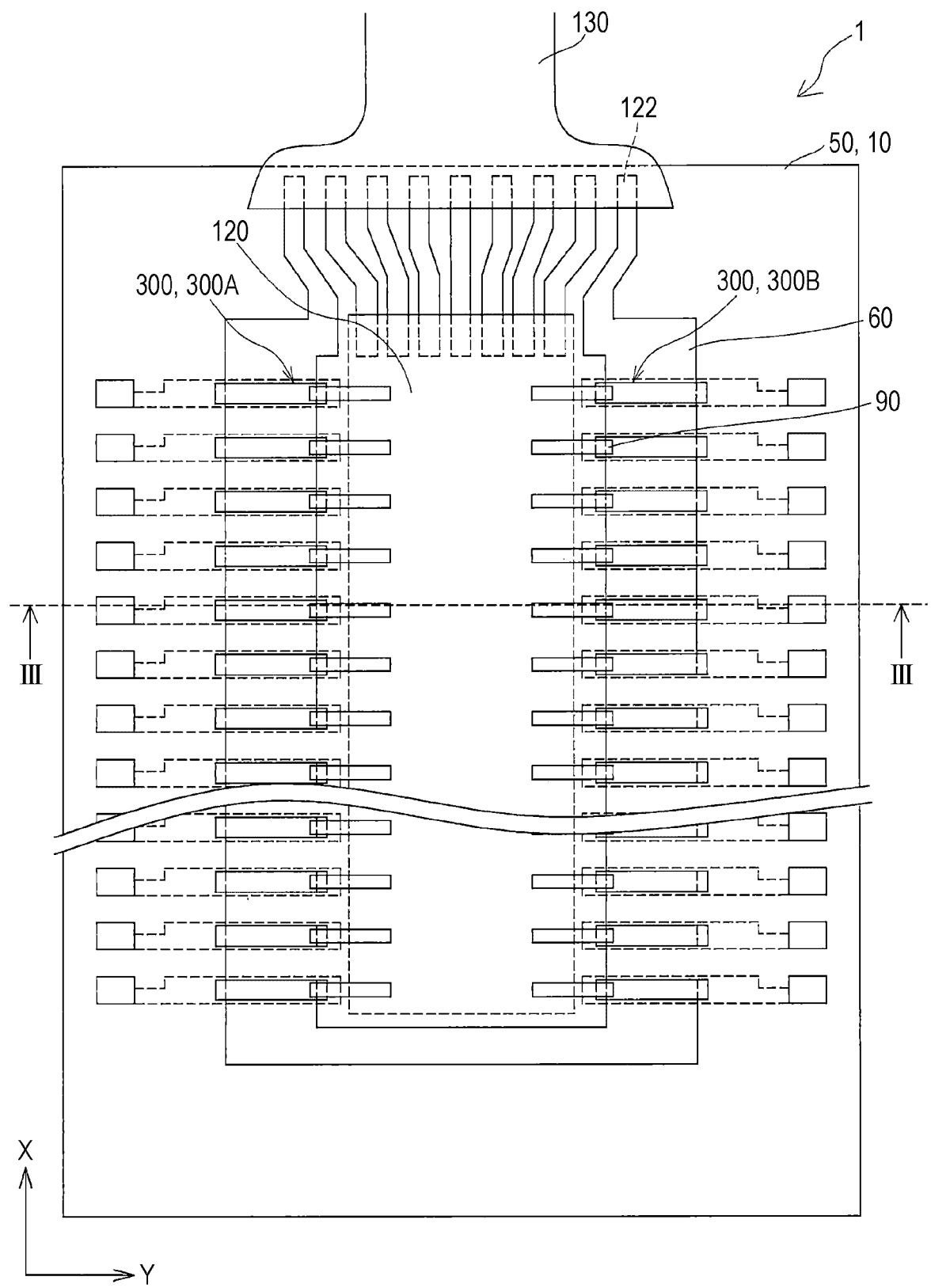
FIG. 2 is a plan view of a main part of the recording head according to Embodiment 1 of the invention.
Figure 3:
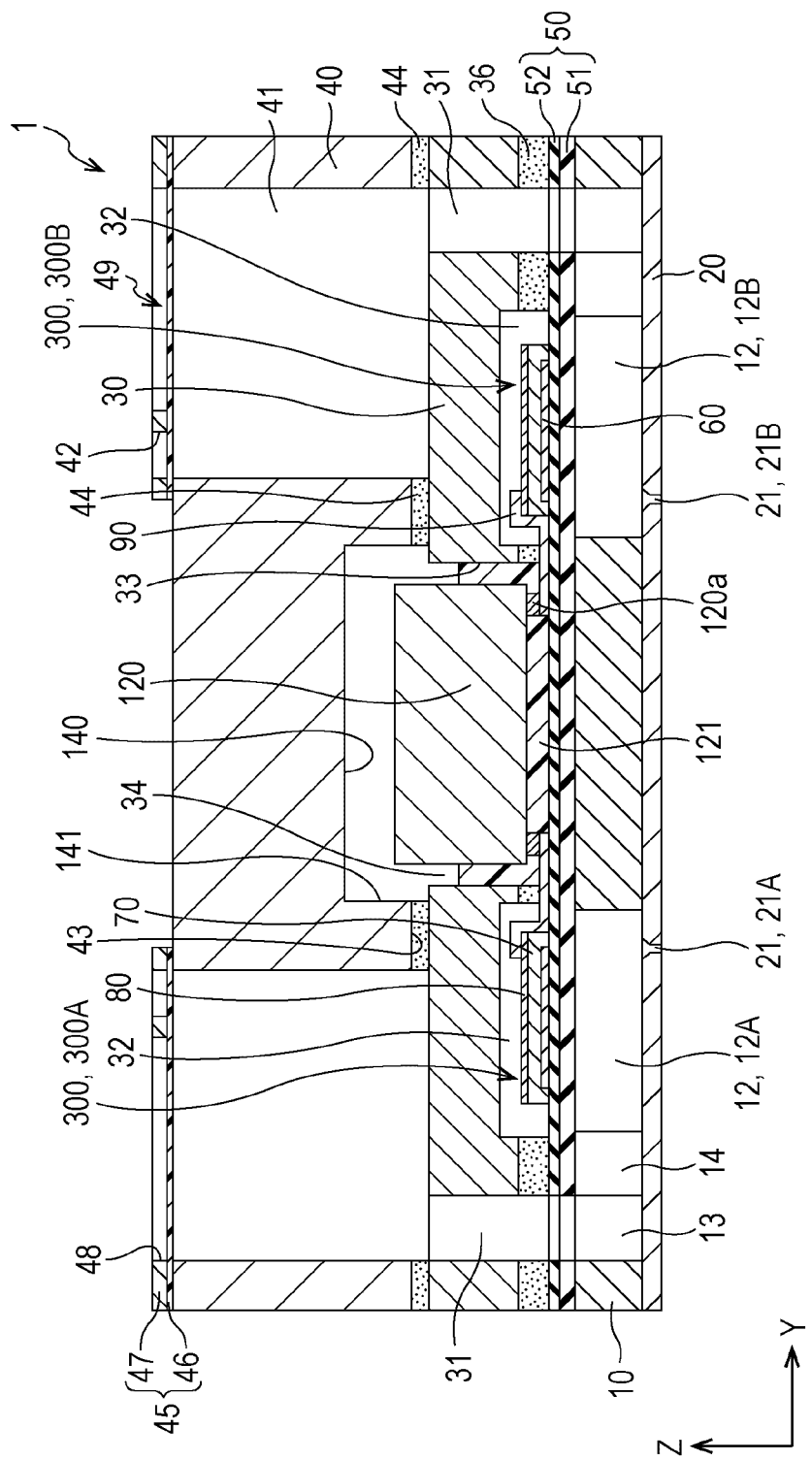
FIG. 3 is a cross-sectional view of the recording head according to Embodiment 1 of the invention.
Figure 4:
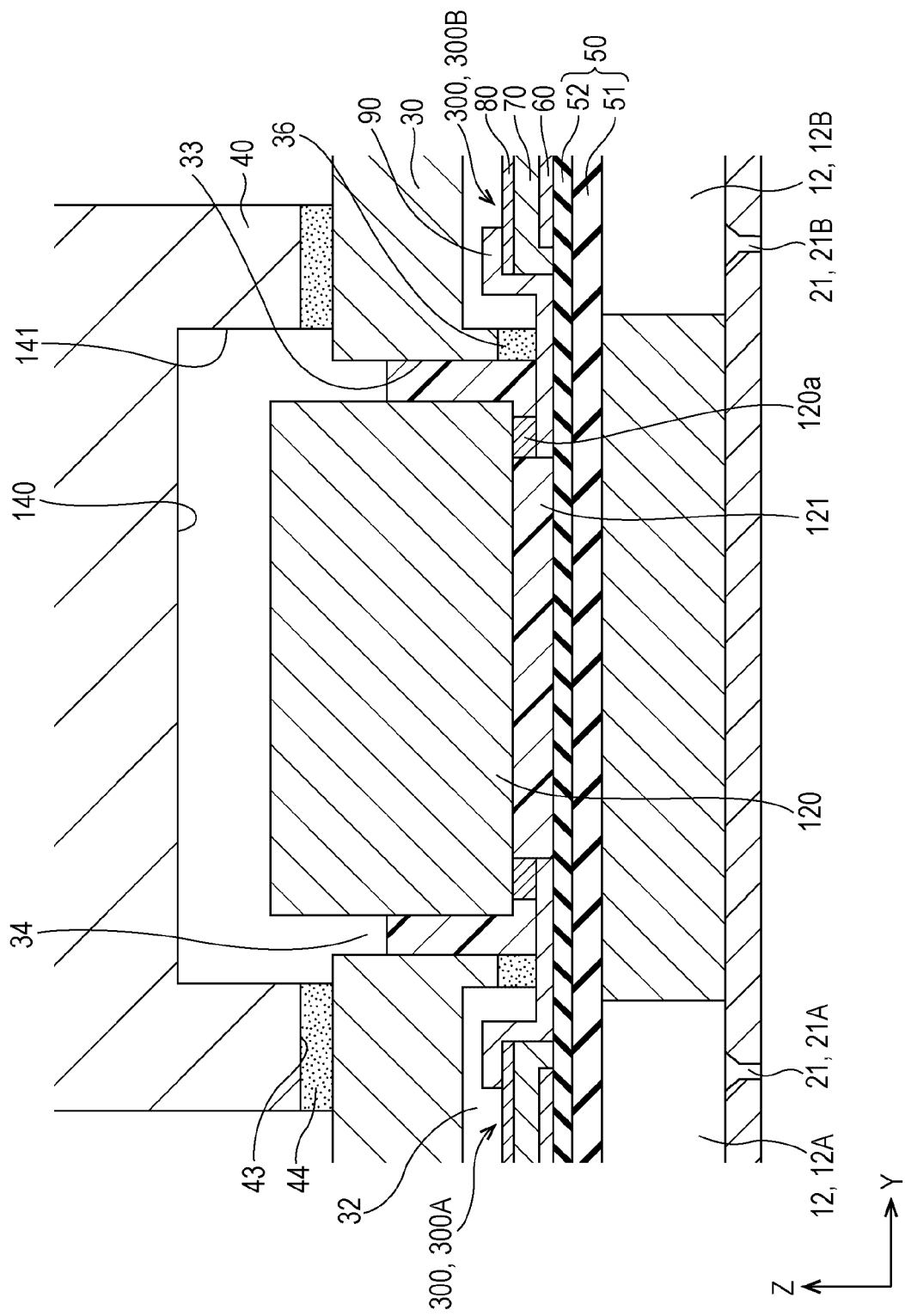
FIG. 4 is a cross-sectional view of the main part of the recording head according to Embodiment 1 of the invention.

FIG. 1 is an exploded perspective view of an ink jet type recording head which is an example of a liquid ejecting head according to Embodiment 1 of the invention, FIG. 2 is a plan view of a main part of a flow path forming substrate of the ink jet type recording head, FIG. 3 is a cross-sectional view of the ink jet type recording head conforming to a line III-III of FIG. 2, and FIG. 4 is an enlarged view of a main part of FIG. 3.

As shown in the drawing, as a flow path forming substrate 10 constituting an ink jet type recording head 1 (hereinafter, simply referred to as recording head 1), a metal such as stainless steel, nickel (Ni), ceramic materials represented by zirconium oxide ($ZrO_x$) or aluminum oxide ($Al_xO_y$), glass ceramic materials, oxide such as silicon oxide ($SiO_x$), magnesium oxide (MgO), lanthanum aluminate ($LaAlO_3$), or the like can be used. In the embodiment, the flow path forming substrate 10 is made of a silicon single crystal substrate.

The flow path forming substrate 10 is anisotropically etched from one surface side so that pressure generation chambers 12 which are recessed portions partitioned by a plurality of partition walls are disposed in parallel along the first direction X in which a plurality of nozzles 21 for ejecting ink are disposed in parallel. In addition, in the flow path forming substrate 10, a plurality of rows in which the pressure generation chambers 12 are disposed in parallel in the first direction are provided in the second direction Y, and two rows are provided in the embodiment. In the embodiment, the pressure generation chambers 12 constituting one row are referred to as a first pressure generation chamber 12A, and the pressure generation chambers 12 constituting the other row are referred to as a second pressure generation chamber 12B. In addition, in the flow path forming substrate 10, an ink supply path 14 and a first liquid supply chamber 13 are partitioned by partition walls on one end side of the pressure generation chamber 12 in the second direction Y. That is, in the embodiment, the flow path forming substrate 10 is provided with the pressure generation chamber 12, the ink supply path 14, and the first liquid supply chamber 13 as individual flow paths communicating with the respective nozzles 21. That is, the first liquid supply chamber 13 of the embodiment is provided independently in each of the pressure generation chambers 12. In the embodiment, although the first liquid supply chamber 13 is provided independently in each of the pressure generation chambers 12, the invention is not limited thereto, and the first liquid supply chamber 13 may be provided so as to communicate in common with a plurality of pressure generation chambers 12. That is, the first liquid supply chamber 13 may constitute a portion of the common liquid chamber communicating in common with the plurality of individual flow paths.

The ink supply path 14 is formed with a width narrower than that of the pressure generation chamber 12 in the first direction X, and keeps the flow path resistance of the ink flowing from the first liquid supply chamber 13 into the pressure generation chamber 12 constant. The ink supply path 14 is not limited to the configuration that narrows the width, and the height in the third direction Z may be narrowed. Although not specifically shown, protective films having liquid resistance (ink resistance) are provided on inner wall surfaces of the pressure generation chamber 12, the first liquid supply chamber 13, and the ink supply path 14. The liquid resistance (ink resistance) referred to herein means etching resistance to alkaline ink. As such a protective film, for example, a single layer or a laminate of at least one material selected from tantalum oxide ($TaO_X$), zirconium oxide ($ZrO_X$), nickel (Ni), and chromium (Cr) can be used.

A nozzle plate 20 in which a nozzle 21 communicating with the vicinity of an end portion of each pressure generation chamber 12 on the side opposite to the ink supply path 14 is formed therein is fixed to the surface of the flow path forming substrate 10 on the side where the pressure generation chamber 12 is open by an adhesive, a heat welding film, or the like. As the nozzle plate 20, a metal such as stainless steel, nickel (Ni), a silicon single crystal substrate, ceramic materials represented by zirconium oxide ($ZrO_X$) or aluminum oxide ($Al_XO_Y$), glass ceramic materials, oxide such as silicon oxide ($SiO_X$), magnesium oxide (MgO), lanthanum aluminate ($LaAlO_3$), or the like can be used. In the nozzle plate 20, two rows of nozzle rows, a first nozzle row in which a first nozzle 21A communicating with the first pressure generation chamber 12A are disposed in parallel in the first direction X and a second nozzle row in which a second nozzle 21B communicating with the second pressure generation chamber 12B are disposed in parallel in the first direction X, are disposed in parallel in the second direction Y.

On the other hand, a vibration plate 50 is formed on the surface of the flow path forming substrate 10 opposite to the nozzle plate 20. The vibration plate 50 of the embodiment is provided with an elastic film 51 including silicon oxide ($SiO_X$) provided on the flow path forming substrate 10 side, an insulator film 52 including zirconium oxide ($ZrO_X$) provided on the elastic film 51. In the embodiment, the elastic film 51 containing silicon dioxide ($SiO_2$) and the insulator film 52 containing zirconium oxide ($ZrO_2$) are used. The pressure generation chamber 12, the first liquid supply chamber 13, and the ink supply path 14 are formed by anisotropically etching the flow path forming substrate 10 from the surface side to which the nozzle plate 20 is bonded, and the surface of the pressure generation chamber 12 opposite to the nozzle plate 20 is partitioned by the elastic film 51.

The vibration plate 50 may be provided with only one of the elastic film 51 and the insulator film 52, or may be further provided with another film in addition to the elastic film 51 and the insulator film 52. In addition, the vibration plate 50 is not limited to the one including silicon oxide and zirconium oxide, and for example, silicon nitride (SiN), titanium oxide ($TiO_X$) or the like may be used. That is, as the vibration plate 50, a single layer or a laminate of at least one material selected from silicon oxide, zirconium oxide, silicon nitride, and titanium oxide can be used.

On the vibration plate 50 of the flow path forming substrate 10, a first electrode 60, a piezoelectric layer 70, and a second electrode 80 are laminated by film formation and lithography to form a piezoelectric element 300. In the embodiment, the piezoelectric element 300 is a drive element that causes pressure change in the ink in the pressure generation chamber 12. Here, the piezoelectric element 300 is referred to as a piezoelectric actuator, and is a portion including the first electrode 60, the piezoelectric layer 70, and the second electrode 80. In general, one of the electrodes of the piezoelectric element 300 is used as a common electrode common to the plurality of piezoelectric elements 300, and the other electrode is configured as an individual electrode independent for each piezoelectric element 300. In the embodiment, the first electrode 60 is used as a common electrode and the second electrode 80 is used as an individual electrode, but this configuration may be reversed.

As the first electrode 60, for example, a noble metal such as platinum (Pt), iridium (Ir), conductive oxides represented by lanthanum nickel oxide (LNO), iridium oxide ($IrO_2$) and the like, or a laminated film thereof, which is a material capable of maintaining conductivity without oxidizing when forming the piezoelectric layer 70, is preferably used.

In addition, as the first electrode 60, an adhesion layer for securing adhesion strength between the above-described conductive material and the vibration plate 50 may be used. In the embodiment, although not shown, titanium is used as the adhesion layer. As the adhesion layer, zirconium, titanium, titanium oxide, or the like can be used. That is, in the embodiment, the first electrode 60 is formed of an adhesion layer made of titanium and at least one conductive layer selected from the above-described conductive materials.

The piezoelectric layer 70 is made of an oxide piezoelectric material having a polarization structure formed on the first electrode 60, may be made of, for example, a perovskite oxide represented by the general formula $ABO_3$, and a lead-based piezoelectric material containing lead, a lead-free piezoelectric material containing no lead, or the like can be used. The piezoelectric layer 70 can be formed by a liquid phase method such as a sol-gel method and a metal-organic decomposition (MOD) method, a physical vapor deposition (PVD) method (vapor phase method) such as a sputtering method, and a laser ablation method, for example.

It is desirable that the second electrode 80 can favorably form an interface with the piezoelectric layer 70, and is a material that can exhibit conductivity and piezoelectric characteristics. As the second electrode 80, a noble metal material such as iridium (Ir), platinum (Pt), palladium (Pd), and gold (Au), or a conductive oxide represented by lanthanum nickel oxide (LNO) is preferably used. In addition, the second electrode 80 may be a laminate of a plurality of materials. In the embodiment, a laminated electrode of iridium and titanium (iridium is in contact with piezoelectric layer 70) is used. The second electrode 80 can be formed by a physical vapor deposition (PVD) method (vapor phase method) such as a sputtering method, a liquid phase method such as a sol-gel method and a metal-organic decomposition (MOD) method, and a plating method. In addition, by performing heat treatment after forming the second electrode 80, characteristics of the piezoelectric layer 70 can be improved.

Such a second electrode 80 is formed only on the piezoelectric layer 70, that is, only on the surface of the piezoelectric layer 70 on the side opposite to the flow path forming substrate 10.

In the embodiment, the piezoelectric element 300 corresponding to the first pressure generation chamber 12A constituting one row is referred to as a first piezoelectric element 300A, and the piezoelectric element 300 corresponding to the second pressure generation chamber 12B constituting the other row is referred to as a second piezoelectric element 300B. That is, in the flow path forming substrate 10, two rows of the row of the first piezoelectric element 300A and the row of the second piezoelectric element 300B disposed in parallel in the first direction X are provided in the second direction Y.

In addition, a lead electrode 90 made of, for example, gold (Au) or the like is provided from the second electrode 80 of the piezoelectric element 300. One end portion of the lead electrode 90 is connected to the second electrode 80 and the other end portion extends to the side opposite to the ink supply path 14 of the flow path forming substrate 10. That is, the lead electrode 90 extends between the first piezoelectric element 300A and the second piezoelectric element 300B in the second direction Y. A drive circuit 120 made of a semiconductor integrated circuit (IC) for driving the piezoelectric element 300 described in detail later is flip-chip mounted on the leading end portion of the extended lead electrode 90. That is, in the drive circuit 120, the terminal portion 120a is mounted on the lead electrode 90 between the first piezoelectric element 300A and the second piezoelectric element 300B. In addition, a space between the drive circuit 120 and the flow path forming substrate 10 (vibration plate 50), and a space between the drive circuit 120 and a protective substrate 30 is filled with a filler 121 as an underfill agent.

In addition, as shown in FIG. 2, an input wiring 122 is provided on the vibration plate 50 of the flow path forming substrate 10. One end of the input wiring 122 is connected to the terminal portion 120a of the drive circuit 120, the other end is extended to one end of the flow path forming substrate 10 in the second direction Y, an external wiring 130 for supplying a signal for controlling the drive of the recording head 1 is connected to the leading end portion of the extended input wiring 122. The external wiring 130 is, for example, a flexible cable such as flexible flat cable (FFC) or flexible printed circuits (FPC). A signal from the external wiring 130 is supplied to the drive circuit 120 via the input wiring 122.

Furthermore, a protective substrate 30 is bonded to the surface of the flow path forming substrate 10 on the piezoelectric element 300 side. In the embodiment, the flow path forming substrate 10 and the protective substrate 30 are bonded using an adhesive 36. As the protective substrate 30, a metal such as stainless steel, nickel (Ni), a silicon single crystal substrate, ceramic materials represented by zirconium oxide ($ZrO_X$) or aluminum oxide ($Al_XO_Y$), glass ceramic materials, oxide such as silicon oxide ($SiO_X$), magnesium oxide (MgO), lanthanum aluminate ($LaAlO_3$), or the like can be used. As such a protective substrate 30, a material having the same linear expansion coefficient as that of the flow path forming substrate 10 is preferable. Incidentally, in a case where the protective substrate 30 is made of a material having a greatly different linear expansion coefficient from that of the flow path forming substrate 10, by being heated or cooled, warpage occurs due to a difference in linear expansion coefficient between the flow path forming substrate 10 and the protective substrate 30. In the embodiment, warpage due to heat can be inhibited by using the same material as the flow path forming substrate 10, that is, a silicon single crystal substrate as the protective substrate 30.

In addition, the protective substrate 30 is provided with a second liquid supply chamber 31 which is a flow path for supplying ink to the first liquid supply chamber 13 of the flow path forming substrate 10. The second liquid supply chamber 31 is provided with a size communicating in common with a plurality of first liquid supply chambers 13. That is, the opening of the second liquid supply chamber 31 on the flow path forming substrate 10 side is provided continuously over the plurality of first liquid supply chambers 13 disposed in parallel in the first direction X, and configures a portion of a common flow path communicating with a plurality of individual flow paths. In the second liquid supply chamber 31, although not specifically shown, a protective film similar to the protective film provided in the flow path of the flow path forming substrate 10 is provided.

As described above, in the embodiment, the flow path forming substrate 10 provided with the recessed portion represented by the pressure generation chamber 12, the vibration plate 50, the piezoelectric element 300, the protective substrate 30, and a case member 40 which is a flow path member are collectively referred to as a piezoelectric device.

On the other hand, a piezoelectric element holding portion 32 is provided in a region of the protective substrate 30 opposed to the piezoelectric element 300. Since the piezoelectric element 300 is formed in the piezoelectric element holding portion 32, the piezoelectric element 300 is protected in a state hardly affected by the external environment. The piezoelectric element holding portion 32 may be sealed or not sealed.

In addition, a drive circuit holding portion 33 is provided between the piezoelectric element holding portions 32 of the protective substrate 30. The drive circuit holding portion 33 is provided penetrating the protective substrate 30 in the third direction Z which is the thickness direction, and the drive circuit 120 for driving the piezoelectric element 300 is provided inside the drive circuit holding portion 33.

Here, one opening of the drive circuit holding portion 33 penetrating in the third direction Z of the protective substrate 30 is blocked with the flow path forming substrate 10, and the other opening is covered with a case member 40 which is a flow path member. A space 34 is formed by the flow path forming substrate 10 and the case member 40 which block the openings on both sides of the drive circuit holding portion 33 and the drive circuit holding portion 33 in the third direction Z of the protective substrate 30, and the drive circuit 120 is held in the space 34.

The thickness of the drive circuit 120 of the embodiment in the third direction Z is thicker than the thickness of the protective substrate 30. Therefore, the drive circuit 120 protrudes toward the case member 40 side of the protective substrate 30 in the third direction Z.

As described above, by making the drive circuit 120 thicker than the protective substrate 30, handling when mounting the drive circuit 120 is improved, and mounting of the drive circuit 120 can be easily performed. In addition, since the drive circuit 120 protrudes toward the case member 40 side from the protective substrate 30, the drive circuit 120 can be pressed with a tool larger than a top surface of the drive circuit 120 when mounting the drive circuit 120, the uniformity of load and heating is improved, and the drive circuit 120 can be stably mounted.

In addition, on the protective substrate 30, the case member 40 which is the flow path member of the embodiment is adhered via an adhesive 44.

A third liquid supply chamber 41 communicating with the second liquid supply chamber 31 of the protective substrate 30 is formed in the case member 40. In the embodiment, the third liquid supply chamber 41 is provided penetrating the case member 40 in the third direction Z which is the lamination direction. An opening of the third liquid supply chamber 41 on the protective substrate 30 side has an opening larger than that of the second liquid supply chamber 31 and a portion of the opening of the third liquid supply chamber 41 on the protective substrate 30 side is sealed with the surface of the protective substrate 30 on the case member 40 side. The third liquid supply chamber 41 is provided with two of a third liquid supply chamber 41 which is a first flow path communicating with the plurality of first pressure generation chambers 12A and a third liquid supply chamber 41 which is a second flow path communicating with the plurality of second pressure generation chambers 12B. Two such third liquid supply chambers 41 are disposed in parallel in the second direction Y.

The case member 40 is adhered to the surface of the protective substrate 30 opposite to the flow path forming substrate 10 by the adhesive 44, so that the space 34 is formed by the protective substrate 30, the flow path forming substrate 10, and the protective substrate 30, and the drive circuit 120 is disposed in the space 34.

In addition, the case member 40 is provided with a hole portion 140 that is open to the space 34. In the embodiment, the hole portion 140 is formed by a recessed portion formed without penetrating the case member 40 in the third direction Z, which is the lamination direction of the protective substrate 30 and the case member 40. The hole portion 140 is not limited to the recessed portion as long as the hole portion 140 is open to the space 34, and may be a through-hole penetrating the case member 40 in the third direction Z. That is, the hole portion 140 refers to a portion having a side wall 141 extending in a direction where intersects an adhesive surface 43 continuously from the adhesive surface 43 of the case member 40 which is a flow path member with the protective substrate 30, in a third direction Z intersecting the plane direction including the first direction X and the second direction Y in the embodiment, and away from the drive circuit 120.

In addition, in the embodiment, the end portion of the side wall 141 of the hole portion 140 on the drive circuit 120 side is located outside the drive circuit 120. That is, the opening of the hole portion 140 on the drive circuit 120 side has an opening larger than that of the drive circuit 120, and when the opening of the hole portion 140 is projected in the third direction Z, the opening is located at a position that encloses the drive circuit 120. That is, the entire surface of the drive circuit 120 is enclosed in the opening portion of the hole portion 140 on the drive circuit 120 side so as to be opposite to each other.

Therefore, the case member 40 and the drive circuit 120 are not adhered to each other and disposed with a gap therebetween.

That is, when the adhesive 44 protrudes from the adhesive surface 43 due to the load, the adhesive 44 for adhering the case member 40 and the protective substrate 30 flows into the hole portion 140 along the side wall 141 from the end portion of the side wall 141 of the hole portion 140 located outside the drive circuit 120. Therefore, the excessive adhesive protruding from the adhesive surface 43 does not adhere to the drive circuit 120, and the drive circuit 120 and the case member 40 are not adhered to each other.

Therefore, a force is inhibited from acting in a direction where the drive circuit 120 floats up toward the case member 40 due to the curing shrinkage of the adhesive, so that occurrence of mounting failure of the mounting portion of the drive circuit 120 and migration due to adhesion of moisture such as humidity to the floated terminal portion 120a can be inhibited.

In addition, in the embodiment, the hole portion 140 is formed as a recessed portion that is open to the drive circuit 120 side. By providing the hole portion 140 including the recessed portion as described above, it is possible to inhibit the rigidity of the case member 40 from being significantly lowered, and to inhibit lowering of the accuracy of the case member 40 due to a decrease in rigidity, in particular, lowering of the surface accuracy of the adhesive surface. Therefore, by providing the hole portion 140 including the recessed portion, the surface accuracy of the adhesive surface of the case member 40 can be improved, and it is possible to control the protrusion amount of the adhesive from the adhesive surface of the case member 40 to the protective substrate 30. Therefore, it is unnecessary to increase the adhesion width for adhering the case member 40 and the protective substrate 30 in consideration of the protrusion amount of the adhesive, so that it is possible to reduce the size.

It is preferable that the surface roughness of the side wall 141 of the hole portion 140 be larger than the surface roughness of the adhesive surface 43 to the protective substrate 30 as the surface on which the hole portion 140 of the case member 40 is open. As described above, the surface roughness of the side wall 141 of the hole portion 140 is made larger than the surface roughness of the adhesive surface 43 to the protective substrate 30, so that the excessive adhesive protruding from the adhesive surface 43 with the protective substrate 30 can be transmitted to the side wall 141 of the hole portion 140 by capillary phenomenon. Therefore, it is difficult for the excessive adhesive to flow out to the drive circuit 120 side, and it is possible to control the thickness of the adhesive 44 between the case member 40 and the protective substrate 30 with high accuracy without adhering the case member 40 to the drive circuit

120. In addition, since the excess adhesive on the adhesive surface 43 can be caused to flow into the hole portion 140, it is possible to inhibit the adhesive on the adhesive surface 43 from flowing out into the flow path on the side opposite to the drive circuit 120. Therefore, it is possible to inhibit occurrence of foreign matter caused by peeling of the excess adhesive flowing into the flow path, and to inhibit discharge failure such as clogging of the nozzle 21.

In addition, in the embodiment, the case member 40 is formed to include one member integrated with a portion where one third liquid supply chamber 41 as the first flow path is formed and adhered to the protective substrate 30 by the adhesive 44, and a portion where the other third liquid supply chamber 41 as the second flow path is formed and adhered to the protective substrate 30 by the adhesive 44.

As described above, by forming the case member 40 with a single member, when adhering the case member 40 to the protective substrate 30, it is easy to uniformly apply a load to the adhesive surface 43, and the adhesion strength can be improved. That is, in a case where the case member 40 is formed in separate members with the portion where one third liquid supply chamber 41 as the first flow path is formed and adhered to the protective substrate 30 by the adhesive 44, and the portion where the other third liquid supply chamber 41 as the second flow path is formed and adhered to the protective substrate 30 by the adhesive 44 in the second direction Y, it is difficult to adhere each of the separate members to the protective substrate 30 with the same load, and there is a possibility that the thickness of the adhesive 44 varies and steps are generated. Incidentally, even if the case member 40 is formed of two or more members, if the case member 40 is integrated beforehand and thereafter adhered to the protective substrate 30, the load at the time of adhering can be equalized.

In addition, a compliance substrate 45 including a sealing film 46 and a fixing plate 47 is bonded to a surface of the case member 40 opposite to the protective substrate 30 on which the third liquid supply chamber 41 is open. The sealing film 46 is made of a material having low rigidity and flexibility (for example, polyphenylene sulfide (PPS) film having a thickness of 6 µm), and one surface of the third liquid supply chamber 41 is sealed by the sealing film 46. In addition, the fixing plate 47 is formed of a hard material such as metal. Since a region of the fixing plate 47 facing the third liquid supply chamber 41 is an opening 48 completely removed in the thickness direction, one surface of the third liquid supply chamber 41 is a compliance portion 49 sealed only with the sealing film 46 having the flexibility.

In addition, the compliance substrate 45 is provided with an ink introduction port 42 penetrating in the thickness direction, and ink is supplied from an external ink supply unit (not shown) to the third liquid supply chamber 41 via the ink introduction port 42. That is, in the recording head 1 of the embodiment, after ink is taken in from then external ink supply unit (not shown) via the ink introduction port 42, and the interior thereof is filled with ink from the third liquid supply chamber 41 to the nozzle 21, a voltage is applied between each of the first electrode 60 and the second electrode 80 corresponding to the pressure generation chamber 12 according to the recording signal from the drive circuit 120, and the piezoelectric element 300 and the vibration plate 50 are bent and deformed. Therefore, the pressure in each pressure generation chamber 12 increases, and ink is discharged from the nozzle 21.

As described above, the ink jet type recording head 1, which is a typical example of the liquid ejecting head of the embodiment, includes the nozzle plate 20 on which a first nozzle row including a first nozzle 21A ejecting an ink which is a liquid and a second nozzle row including a second nozzle 21B ejecting an ink which is a liquid are formed, the flow path forming substrate 10 on which a first pressure generation chamber 12A communicating with the first nozzle 21A and a second pressure generation chamber 12B communicating with the second nozzle 21B are formed, the vibration plate 50 that is formed on one surface side of the flow path forming substrate 10, the first piezoelectric element 300A that is provided on the vibration plate 50 at a position corresponding to the first pressure generation chamber 12A, the second piezoelectric element 300B that is provided on the vibration plate 50 at a position corresponding to the second pressure generation chamber 12B, the protective substrate 30 that is bonded to the one surface side of the flow path forming substrate 10, the case member 40 as the flow path member that is adhered to a side of the protective substrate 30 opposite to the flow path forming substrate 10 via the adhesive 44, and in which the third liquid supply chamber 41 as a first flow path communicating with the first pressure generation chamber 12A and the third liquid supply chamber 41 as a second flow path communicating with the second pressure generation chamber 12B are formed, and the drive circuit 120 that is mounted in the space 34 formed so as to be surrounded by the flow path forming substrate 10, the protective substrate 30, and the case member 40, between the first piezoelectric element 300A and the second piezoelectric element 300B of the flow path forming substrate 10 to drive the first piezoelectric element 300A and the second piezoelectric element 300B, in which the case member 40 is provided with the hole portion 140 which is open to a region facing the space 34.

As described above, by providing the hole portion 140 in the case member 40, when the adhesive 44 adhering the case member 40 and the protective substrate 30 protrudes from the adhesive surface 43, it is possible to inhibit the drive circuit 120 and the case member 40 from adhering to each other by allowing the protruded excessive adhesive to flow out into the hole portion 140. Therefore, the drive circuit 120 is inhibited from floating up toward the case member 40 due to the curing shrinkage of the adhesive, occurrence of mounting failure of the mounting portion on the flow path forming substrate 10 of the drive circuit 120 and migration due to adhesion of moisture such as humidity to the floated terminal portion 120a is inhibited, so the reliability of the mounting portion can be improved.

In addition, in the embodiment, the hole portion 140 is a recessed portion provided in the case member 40 which is a flow path member. By providing the hole portion 140 with the recessed portion as described above, it is possible to protect the space 34 provided with the drive circuit 120.

In addition, in the embodiment, the end portion of the side wall 141 of the hole portion 140 is located outside the drive circuit 120. As described above, by providing the hole portion 140 with such a size that the end portion of the side wall 141 is located outside the drive circuit 120, the excessive adhesive protruding from the adhesive surface 43 can flow out into the hole portion 140 before adhering to the drive circuit 120. Therefore, it is possible to inhibit the case member 40 and the drive circuit 120 from being adhered to each other.

In addition, in the embodiment, it is preferable that the surface roughness of the side wall 141 of the hole portion 140 be larger than the surface roughness of the adhesive surface 43 to the protective substrate 30 as the surface on which the hole portion 140 of the case member 40 as the flow path member is open. According to this configuration, the excessive adhesive protruding from the adhesive surface 43 with the protective substrate 30 can be transmitted to the side wall 141 of the hole portion 140 by capillary phenomenon. Therefore, it is difficult for the excessive adhesive to flow out to the drive circuit 120 side, and it is possible to control the thickness of the adhesive 44 between the case member 40 and the protective substrate 30 with high accuracy without adhering the case member 40 to the drive circuit 120. In addition, since the excess adhesive on the adhesive surface 43 can be caused to flow into the hole portion 140, it is possible to inhibit the excessive adhesive on the adhesive surface 43 from flowing out into the flow path on the side opposite to the drive circuit 120. Therefore, it is possible to inhibit occurrence of foreign matter caused by peeling of the excess adhesive flowing into the flow path, and to inhibit discharge failure such as clogging of the nozzle 21.

In addition, in the embodiment, the thickness of the drive circuit 120 is thicker than that of the protective substrate 30. As described above, by making the drive circuit 120 thicker than the protective substrate 30, handling when mounting the drive circuit 120 is improved, and mounting of the drive circuit 120 can be easily performed. In addition, since the drive circuit 120 protrudes toward the case member 40 side from the protective substrate 30, the drive circuit 120 can be pressed with a tool larger than a top surface of the drive circuit 120 when mounting the drive circuit 120, the uniformity of load and heating is improved, and the drive circuit 120 can be stably mounted.

In addition, in the embodiment, the case member 40 as the flow path member is integrated with a portion where one third liquid supply chamber 41 as the first flow path is formed and adhered to the protective substrate 30, and a portion where the other third liquid supply chamber 41 as the second flow path is formed and adhered to the protective substrate 30. According to this configuration, by forming the case member 40 with an integrated member, when adhering the case member 40 to the protective substrate 30, it is easy to uniformly apply a load to the adhesive surface 43, and the adhesion strength can be improved.

Figure 5:
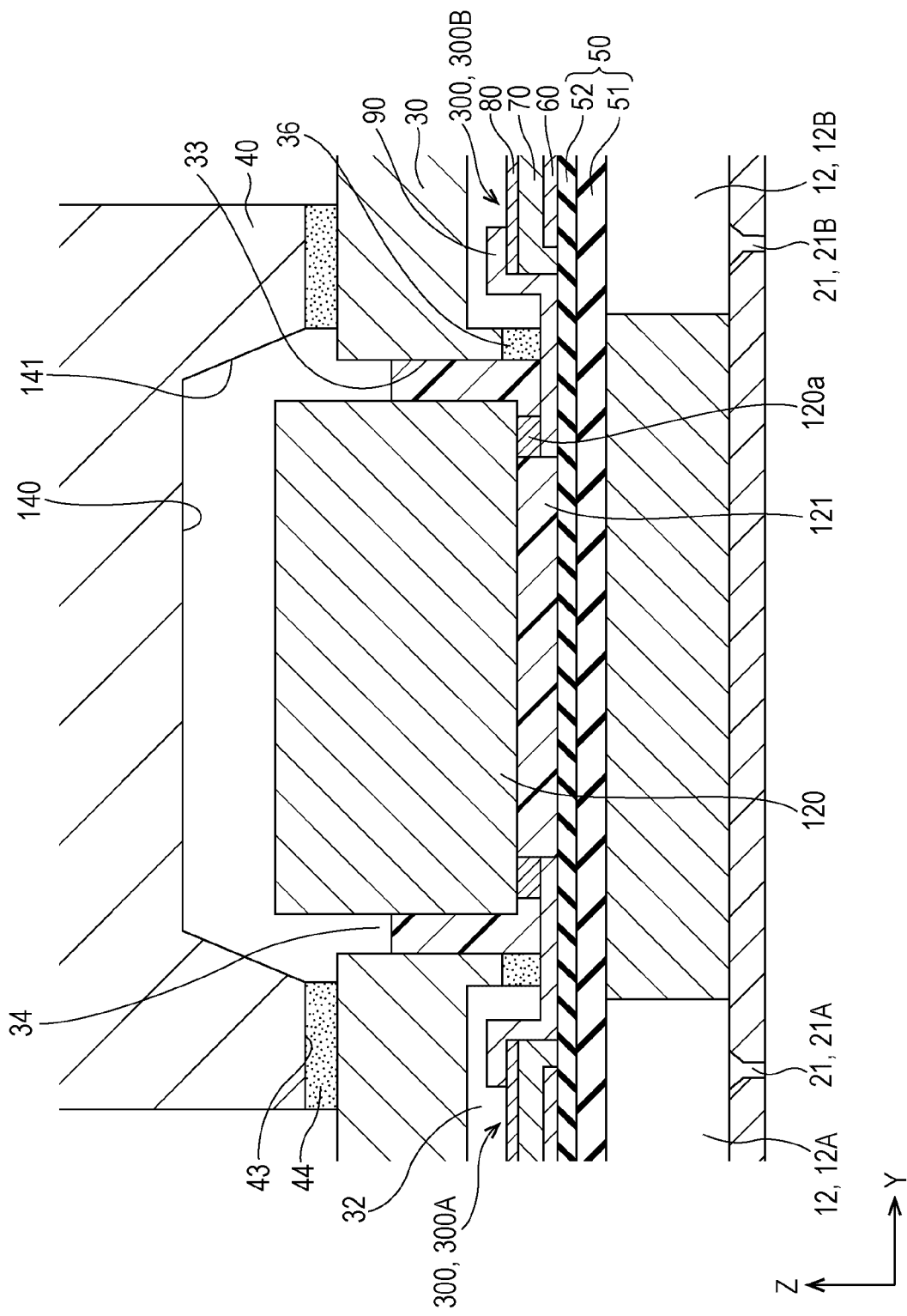
FIG. 5 is a cross-sectional view of a main part of a modified example of the recording head according to Embodiment 1 of the invention.

In the embodiment, the side wall 141 of the hole portion 140 is oriented along the third direction Z and the opening of the hole portion 140 is formed to have the same opening in the third direction Z, but the invention is not particularly limited thereto. For example, as shown in FIG. 5, the side wall 141 of the hole portion 140 may be inclined so that the opening on the drive circuit 120 side is widened. That is, the side wall 141 of the hole portion 140 is inclined so that the opening of the hole portion 140 is widened toward the drive circuit 120 with respect to the third direction Z, which is the lamination direction of the case member 40 as the flow path member and the protective substrate 30.

As described above, the side wall 141 of the hole portion 140 is inclined, so that when the adhesive 44 adhering the case member 40 to the protective substrate 30 protrudes from the adhesive surface 43, it is easy to guide the excessive adhesive along the inclined side wall 141 and the excessive adhesive 44 can be caused to flow into the hole portion 140.

The side wall 141 of the hole portion 140 may be inclined so that the opening on the drive circuit 120 side narrows with respect to the third direction Z. That is, having the side wall 141 extending in a third direction Z in which the hole portion 140 intersects the adhesive surface 43 continuously from the adhesive surface 43 of the case member 40 and in a direction away from the drive circuit 120 means that the side wall 141 has a vector including the third direction Z.

Figure 6:
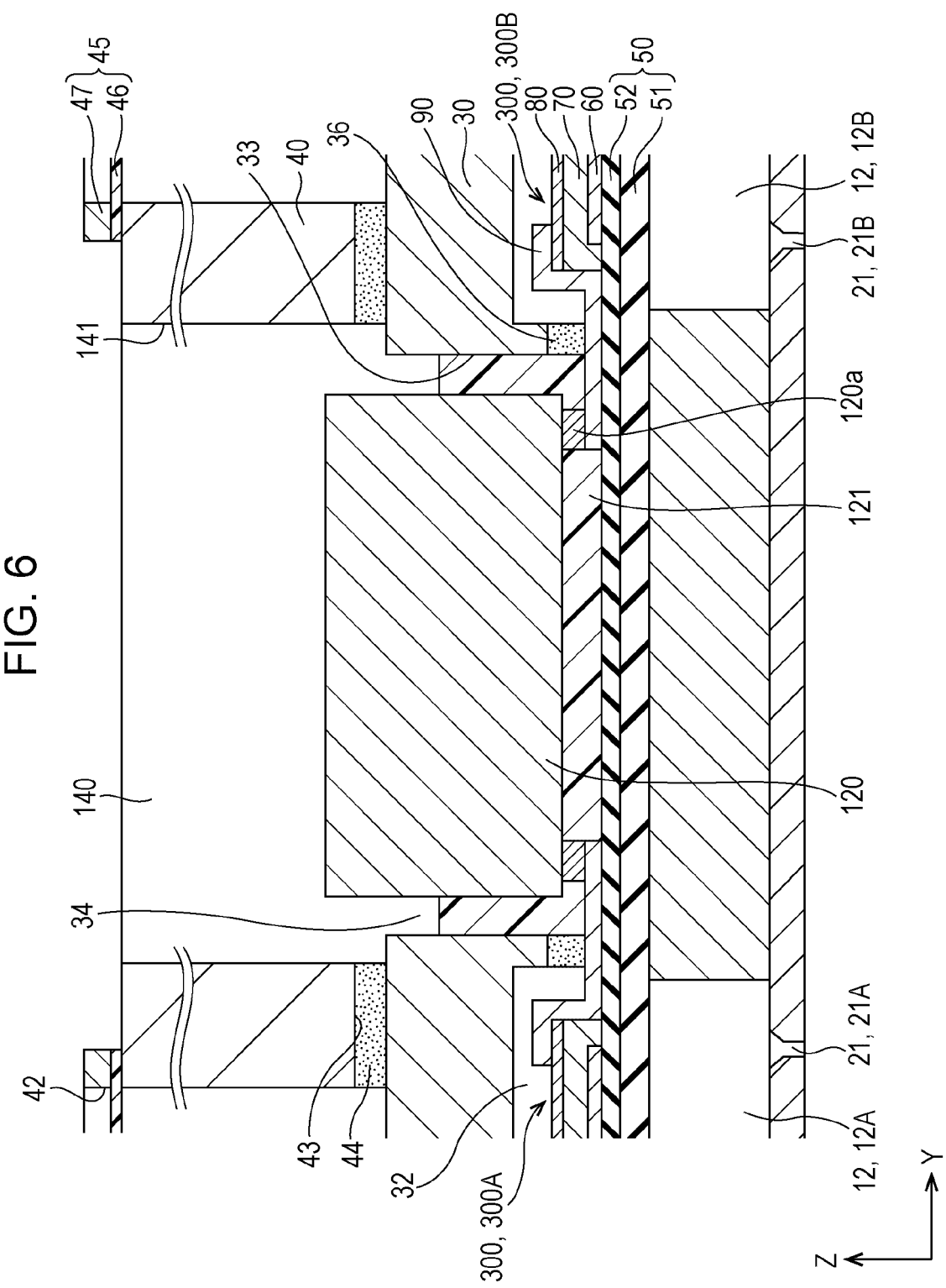
FIG. 6 is a cross-sectional view of the main part of the modified example of the recording head according to Embodiment 1 of the invention.

In addition, in the embodiment, as the hole portion 140, the case member 40 is formed as a recessed portion provided without penetrating the third direction Z which is the thickness direction, but it is not particularly limited thereto. For example, as shown in FIG. 6, the hole portion 140 is a through-hole penetrating the case member 40 in the third direction Z, which is the lamination direction of the case member 40 as the flow path member and the protective substrate 30. As described above, even in a case where the hole portion 140 formed by the through-hole is provided in the case member 40, similarly to the above-described hole portion 140 including the recessed portion, when the adhesive 44 adhering the case member 40 and the protective substrate 30 protrudes from the adhesive surface 43, it is possible to inhibit the drive circuit 120 and the case member 40 from adhering to each other by allowing the protruded excessive adhesive to flow out into the hole portion 140. Therefore, the drive circuit 120 is inhibited from floating up toward the case member 40 due to the curing shrinkage of the adhesive, occurrence of mounting failure of the mounting portion on the flow path forming substrate 10 of the drive circuit 120 and migration due to adhesion of moisture such as humidity to the floated terminal portion 120a is inhibited, so the reliability of the mounting portion can be improved.

In addition, since by forming the hole portion 140 as the through-hole, the space 34 in which the drive circuit 120 is held is open to the atmosphere, that is, communicates with the outside of the recording head 1, it is possible to inhibit the gas generated from the filler 121 from filling the space 34 and discharge the gas to the outside. Therefore, it is possible to inhibit the gas emitted from the filler 121 from moving to the terminal portion of the drive circuit 120 and the bonding interface side between the drive circuit 120 and the flow path forming substrate 10, and to inhibit the occurrence of dew condensation and contamination by the gas at the terminal portion of the drive circuit 120. In addition, since it is difficult for the gas to move to the bonding interface between the drive circuit 120 and the flow path forming substrate 10, occurrence of migration due to deterioration of adhesion of the bonding surface by the gas can be inhibited.

Furthermore, the hole portion 140 is used as the through-hole, so that the external wiring 130 can be inserted into the hole portion 140 and connected to the drive circuit 120. Therefore, it is easy to arrange the external wiring 130, and to arrange the input wiring 122, so that it is possible to reduce the size of the recording head 1.

Embodiment 2

Figure 7:
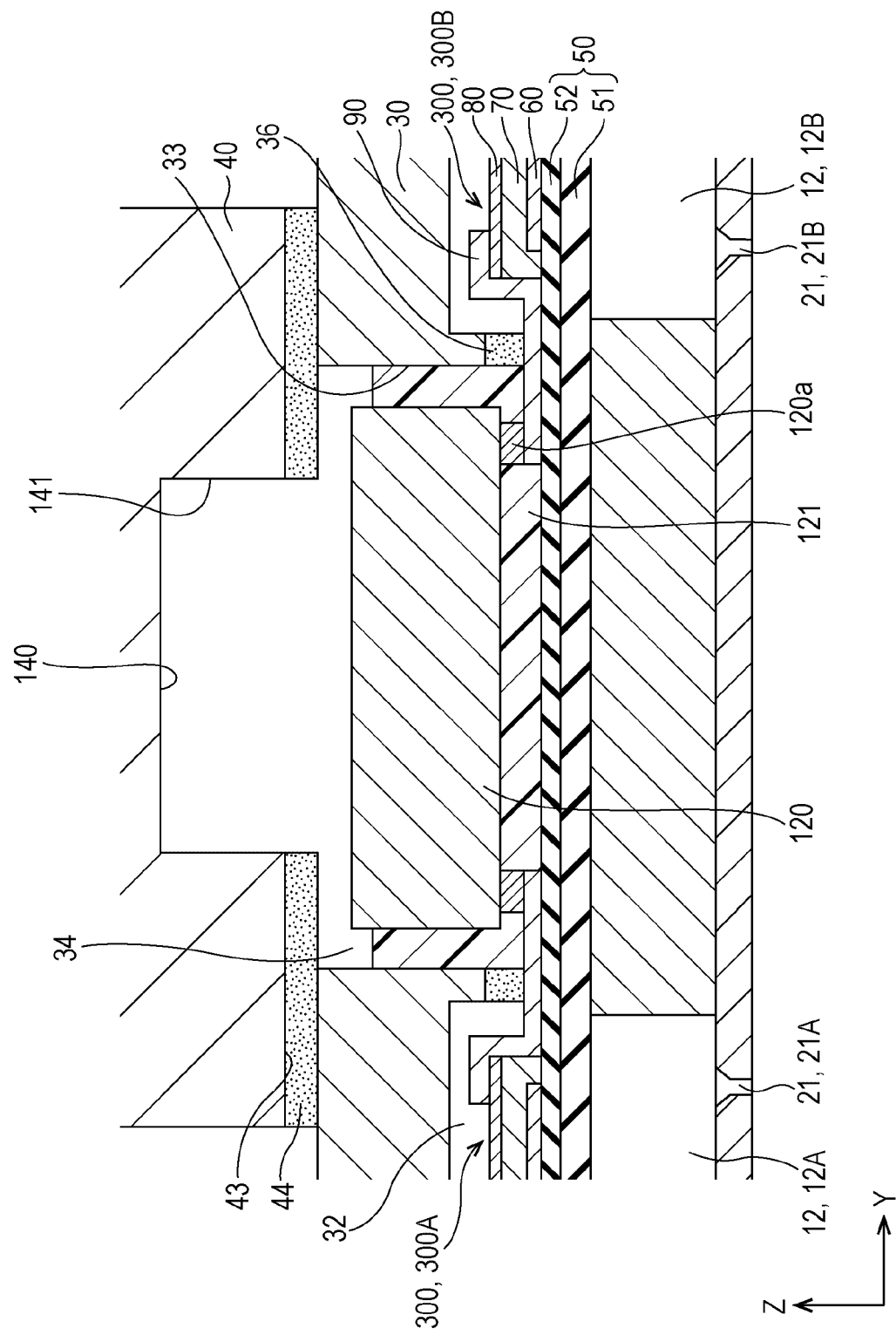
FIG. 7 is a cross-sectional view of a main part of a recording head according to Embodiment 2 of the invention.

FIG. 7 is an enlarged cross-sectional view of a main part of an ink jet type recording head which is an example of a liquid ejecting head according to Embodiment 2 of the invention. The same reference numerals are given to members similar to those in the above-described embodiment, and redundant explanations are omitted.

As shown in FIG. 7, in the drive circuit 120 constituting the recording head 1 of the embodiment, the thickness in the third direction Z, which is the lamination direction, is smaller than that of the protective substrate 30.

In addition, the case member 40 is provided with the hole portion 140. In the embodiment, the hole portion 140 is formed by the recessed portion formed without penetrating the case member 40 in the third direction Z, which is the lamination direction of the protective substrate 30 and the case member 40. The hole portion 140 is not limited to the recessed portion as long as the hole portion 140 is open to the space 34, and may be a through-hole penetrating the case member 40 in the third direction Z. That is, the hole portion 140 refers to a portion having the side wall 141 extending in a direction where intersects the adhesive surface 43 continuously from the adhesive surface 43 of the case member 40 which is a flow path member with the protective substrate 30, in a third direction Z intersecting the plane direction including the first direction X and the second direction Y in the embodiment, and away from the drive circuit 120.

In addition, in the embodiment, the end portion of the side wall 141 of the hole portion 140 on the drive circuit 120 side is disposed at a position opposite to the drive circuit 120 in the third direction Z. That is, the opening of the hole portion 140 on the drive circuit 120 side has an opening smaller than that of the drive circuit 120, and when the opening of the hole portion 140 is projected in the third direction Z, the opening is positioned at a position overlapping with the drive circuit 120. That is, the hole portion 140 is provided in such a size and position that the opening on the drive circuit 120 side is opposite to the drive circuit 120 in the third direction Z.

Even if the hole portion 140 is provided with the opening smaller than that of the drive circuit 120 in this manner, the thickness of the drive circuit 120 in the third direction Z is smaller than that of the protective substrate 30, so that the adhesive protruding from the adhesive 44 for adhering the case member 40 to the protective substrate 30 flows out into the hole portion 140 without adhering to the drive circuit 120. Therefore, the excessive adhesive protruding from the adhesive surface 43 does not adhere to the drive circuit 120, and the drive circuit 120 and the case member 40 are not adhered to each other.

Therefore, a force is inhibited from acting in a direction where the drive circuit 120 floats up toward the case member 40 due to the curing shrinkage of the adhesive, so that occurrence of mounting failure of the mounting portion of the drive circuit 120 and migration due to adhesion of moisture such as humidity to the floated terminal portion 120a can be inhibited.

In addition, in the embodiment, the hole portion 140 is formed as a recessed portion that is open to the drive circuit 120 side. By providing the hole portion 140 including the recessed portion as described above, it is possible to inhibit the rigidity of the case member 40 from being significantly lowered, and to inhibit lowering of the accuracy of the case member 40 due to a decrease in rigidity, in particular, lowering of the surface accuracy of the adhesive surface. Therefore, by providing the hole portion 140 including the recessed portion, the surface accuracy of the adhesive surface of the case member 40 can be improved, and it is possible to control the protrusion amount of the adhesive from the adhesive surface of the case member 40 to the protective substrate 30. Therefore, it is unnecessary to increase the adhesion width for adhering the case member 40 and the protective substrate 30 in consideration of the protrusion amount of the adhesive, so that it is possible to reduce the size.

Similarly to embodiment 1 described above, it is preferable that the surface roughness of the side wall 141 of the hole portion 140 be larger than the surface roughness of the adhesive surface 43 to the protective substrate 30 as the surface on which the hole portion 140 of the case member 40 is open. As described above, the surface roughness of the side wall 141 of the hole portion 140 is made larger than the surface roughness of the adhesive surface 43 to the protective substrate 30, so that the excessive adhesive protruding from the adhesive surface 43 with the protective substrate 30 can be transmitted to the side wall 141 of the hole portion 140 by capillary phenomenon. Therefore, it is difficult for the excessive adhesive to flow out to the drive circuit 120 side, and it is possible to control the thickness of the adhesive 44 between the case member 40 and the protective substrate 30 with high accuracy without adhering the case member 40 to the drive circuit 120. In addition, since the excess adhesive on the adhesive surface 43 can be caused to flow into the hole portion 140, it is possible to inhibit the adhesive on the adhesive surface 43 from flowing out into the flow path on the side opposite to the drive circuit 120. Therefore, it is possible to inhibit occurrence of foreign matter caused by peeling of the excess adhesive flowing into the flow path, and to inhibit discharge failure such as clogging of the nozzle 21.

In addition, in the embodiment, the case member 40 is formed to include one member integrated with a portion where one third liquid supply chamber 41 as the first flow path is formed and adhered to the protective substrate 30 by the adhesive 44, and a portion where the other third liquid supply chamber 41 as the second flow path is formed and adhered to the protective substrate 30 by the adhesive 44.

As described above, by forming the case member 40 with a single member, when adhering the case member 40 to the protective substrate 30, it is easy to uniformly apply a load to the adhesive surface 43, and the adhesion strength can be improved. That is, in a case where the case member 40 is formed in separate members with the portion where one third liquid supply chamber 41 as the first flow path is formed and adhered to the protective substrate 30 by the adhesive 44, and the portion where the other third liquid supply chamber 41 as the second flow path is formed and adhered to the protective substrate 30 by the adhesive 44 in the second direction Y, it is difficult to adhere each of the separate members to the protective substrate 30 with the same load, and there is a possibility that the thickness of the adhesive 44 varies and steps are generated. Incidentally, even if the case member 40 is formed of two or more members, if the case member 40 is integrated beforehand and thereafter adhered to the protective substrate 30, the load at the time of adhering can be equalized.

Figure 8:
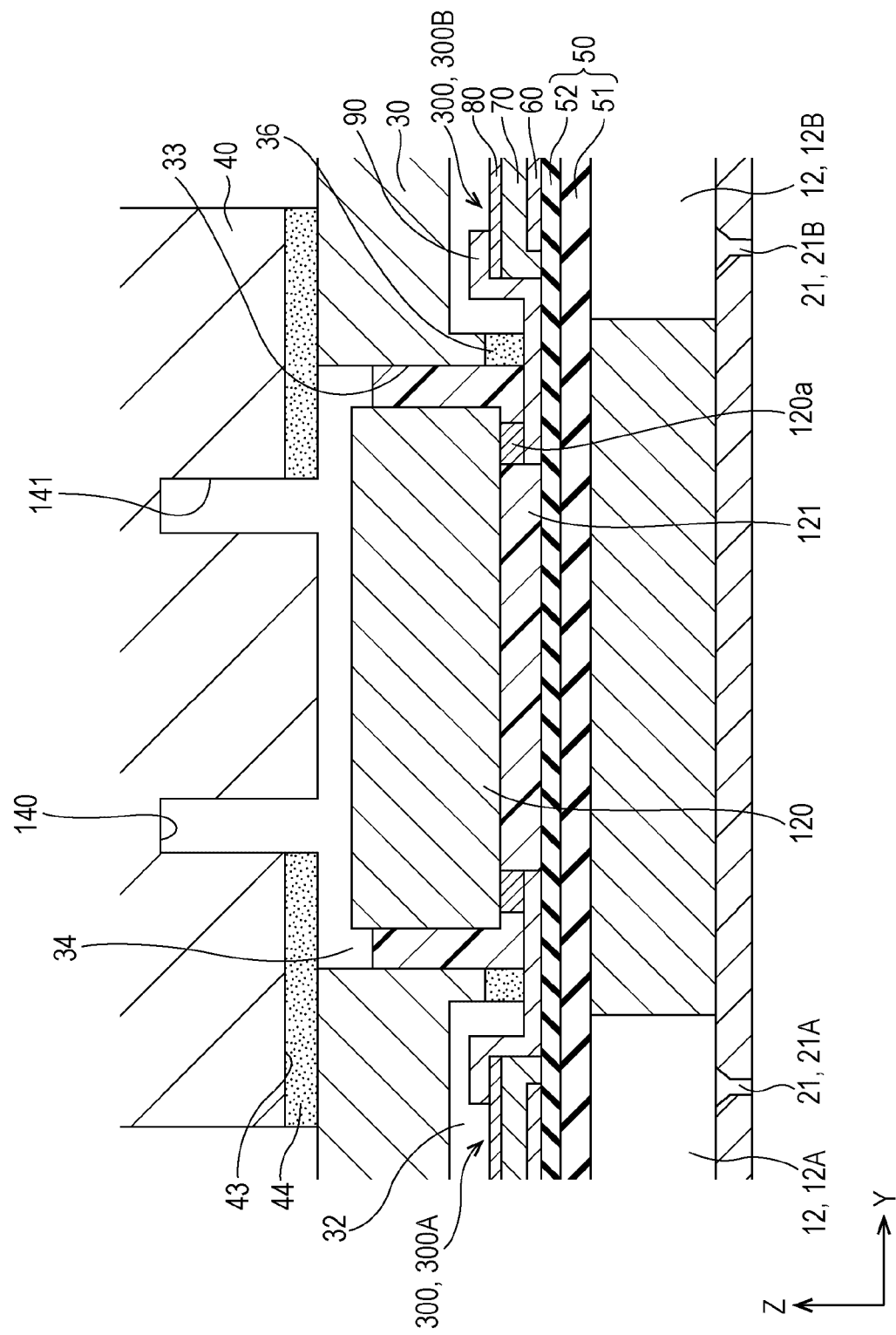
FIG. 8 is a cross-sectional view of a main part of a modified example of the recording head according to Embodiment 2 of the invention.

In the embodiment, one hole portion 140 is provided in the case member 40, but the invention is not limited thereto, and for example, two or more hole portions may be provided. Specifically, as shown in FIG. 8, the case member 40 is provided with two hole portions 140 disposed in parallel in the second direction Y. The side wall 141 closest to the outside of the drive circuit 120 among the side walls 141 of the hole portion 140, that is, the end portions of the drive circuits 120 of the side walls 141 on both outsides in the second direction Y is provided at a position opposite to the drive circuit 120 in the third direction Z. By providing the two hole portions 140 as described above, the excessive adhesive protruding from the adhesive surface 43 is introduced into the hole portion 140, adhesion of the adhesive to the drive circuit 120 is inhibited, and adhering of the case member 40 to the drive circuit 120 can be inhibited.

Figure 9:
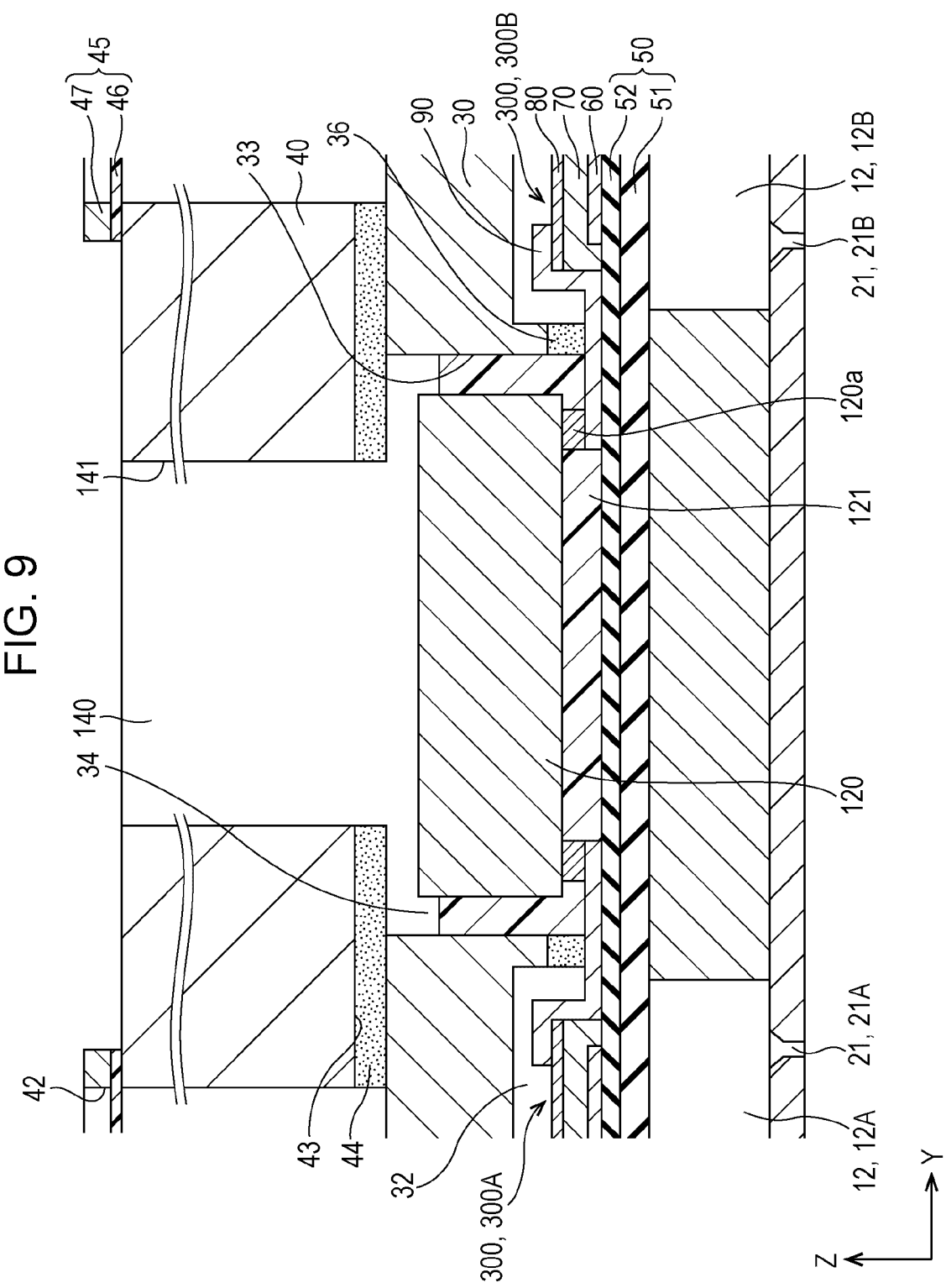
FIG. 9 is a cross-sectional view of the main part of the modified example of the recording head according to Embodiment 2 of the invention.

In addition, in the embodiment, the recessed portion that does not penetrate the case member 40 in the third direction Z which is the thickness direction is provided as the hole portion 140, but it is not particularly limited thereto. For example, as shown in FIG. 9, the hole portion 140 may be a through-hole penetrating the case member 40 in the third direction Z, which is the lamination direction of the case member 40 and the protective substrate 30. In addition, even in a case of providing the hole portion 140 including a through-hole, a plurality of hole portions 140 may be provided similarly to FIG. 8.

In addition, the side wall 141 of the hole portion 140 may be an inclined surface inclined with respect to the third direction Z similarly to Embodiment 1 described above.

Furthermore, in the embodiment, since the thickness of the drive circuit 120 is thinner than that of the protective substrate 30, the end portion of the side wall 141 of the hole portion 140 is opposite to the drive circuit 120 in the third direction Z, but it is not limited thereto. Even in a case where the thickness of the drive circuit 120 is thinner than that of the protective substrate 30, similarly to Embodiment 1 described above, the end portion of the side wall 141 of the hole portion 140 on the drive circuit 120 side may be located outside the drive circuit 120.

Embodiment 3

Figure 10:
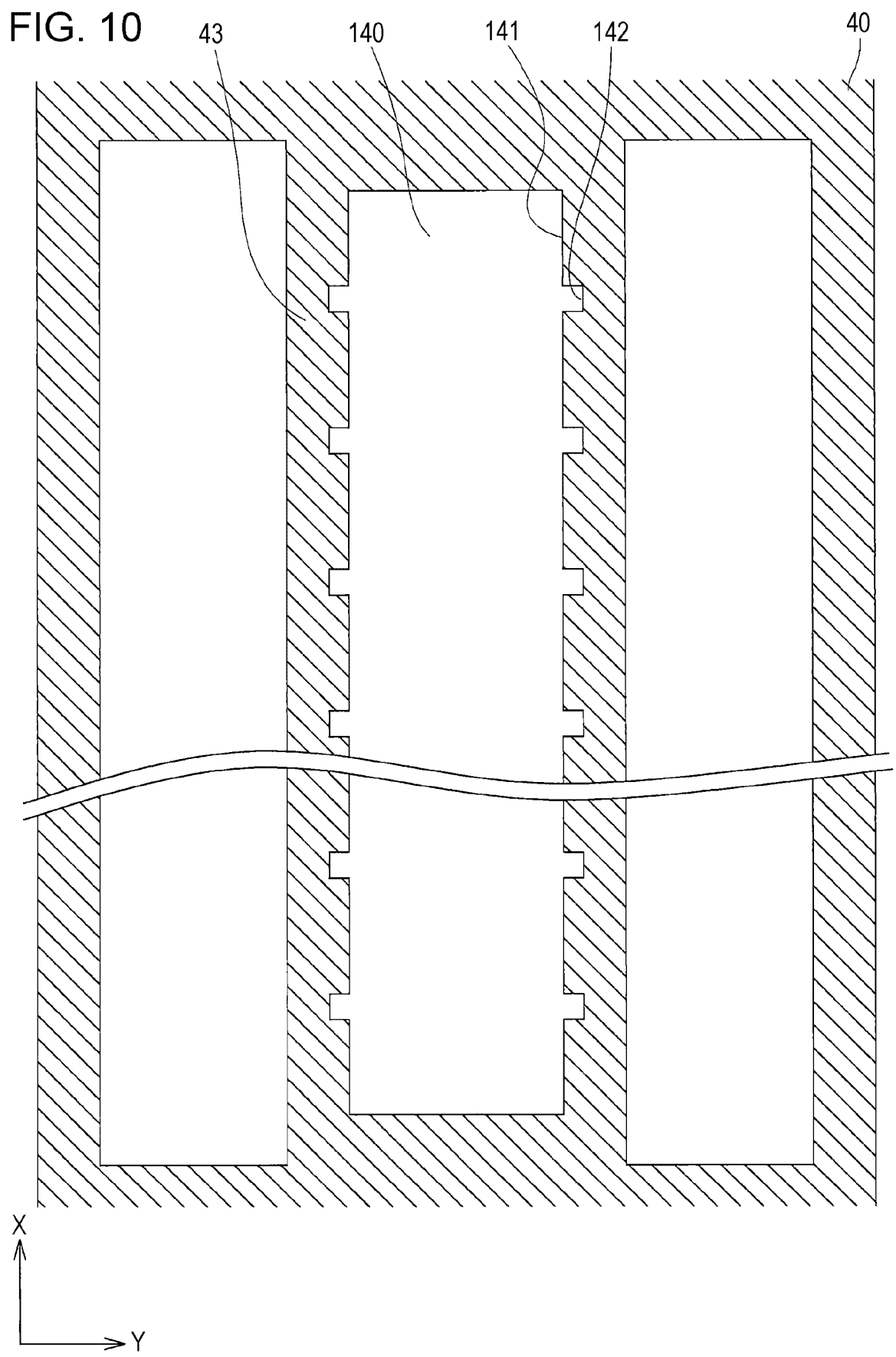
FIG. 10 is a plan view of a case member according to Embodiment 3 of the invention.

FIG. 10 is a plan view of a case member which is a flow path member according to Embodiment 3 of the invention, viewed from the protective substrate side. The same reference numerals are given to members similar to those in the above-described embodiment, and redundant explanations are omitted.

As shown in FIG. 10, the hole portion 140 is provided in the case member 40 which is the flow path member constituting the recording head 1 of the embodiment.

A groove portion 142 is provided on the side wall 141 of the hole portion 140. The groove portion 142 is provided so as to be continuously open in the third direction Z on the side wall 141. In addition, a plurality of groove portions 142 are disposed in parallel at predetermined intervals in the first direction X.

The plurality of groove portions 142 being open along the third direction Z which is the lamination direction of the protective substrate 30 and the case member 40 are provided on the side wall 141 of the hole portion 140 in this manner, so that when the adhesive 44 for adhering the case member 40 to the protective substrate 30 protrudes from the adhesive surface 43, the excessive protruded adhesive can be guided into the groove portion 142 by the capillary force and the excessive protruded adhesive can flow into the hole portion 140. Therefore, the excessive adhesive protruding from the adhesive surface 43 is not adhered to the drive circuit 120, and the case member 40 and the drive circuit 120 are not adhered to each other. Therefore, the mounting portion of the drive circuit 120 does not float up due to the curing shrinkage of the adhesive, and occurrence of the mounting failure and migration can be inhibited.

Other Embodiment

Hereinbefore, although each of the embodiments of the invention is described, the basic configuration of the invention is not limited to the above-described embodiments.

For example, in each of the embodiments described above, an example in which a portion where one third liquid supply chamber 41 as the first flow path of the case member 40 is formed and adhered to the protective substrate 30 by the adhesive 44, and a portion where the other third liquid supply chamber 41 as the second flow path is formed and adhered to the protective substrate 30 by the adhesive 44 are integrated is exemplified, but it is not limited thereto, and a case member 40 in which the above two portions are separate may be used. That is, the case member 40 may be configured to include a plurality of members. However, in a case where the case member 40 is formed to include the plurality of members, if the case member 40 is integrated beforehand into a single member and thereafter adhered to the protective substrate 30 and the drive circuit 120, the load at the time of adhering can be equalized. It goes without saying that in a case where the case member 40 is configured to include the plurality of members, the plurality of members may be individually adhered to the protective substrate 30 and the drive circuit 120.

In addition, in each of the embodiments described above, the side wall 141 of the hole portion 140 is a surface along the third direction Z or a surface inclined with respect to the third direction Z, but it is not particularly limited thereto, and a step may be provided in the middle of the side wall 141. That is, the opening of the hole portion 140 may be provided in different sizes step by step in the third direction Z so as to form a step on the side wall 141 of the hole portion 140.

In addition, in each of the embodiments described above, the ink supply path 14 and the first liquid supply chamber 13 are provided in the flow path forming substrate 10, but it is not particularly limited thereto, either one or both of the first liquid supply chamber 13 and the ink supply path 14 may not be provided.

In addition, in each of the embodiments described above, the compliance portion 49 is provided, and the compliance portion 49 may not be provided as long as the ink itself absorbs pressure fluctuation, for example.

In addition, in each of the embodiments described above, a configuration in which one drive circuit 120 is provided is exemplified, but it is not particularly limited thereto, and a plurality of drive circuits of two or more may be provided in the first direction X. In addition, a drive circuit may be provided for each of the first piezoelectric element 300A row and the second piezoelectric element 300B row. That is, the drive circuits may be disposed in parallel in the second direction Y.

Furthermore, each of the above-described embodiments is described using the thin film type piezoelectric element 300 as a drive element that causes a pressure change in the pressure generation chamber 12, but the invention is not limited thereto. For example, it is possible to use a thick film type piezoelectric element formed by a method such as attaching a green sheet or the like, or a longitudinal vibration type piezoelectric element which alternately laminates a piezoelectric material and an electrode forming material to expand and contract in the axial direction. In addition, as the drive element, it is possible to use a device in which a heat generation element is disposed in the pressure generation chamber to discharge the liquid droplets from the nozzle by bubbles generated by heat generation of the heat generation element, or a so-called electrostatic actuator which generates static electricity between the vibration plate and the electrode and deforms the vibration plate by the electrostatic force to discharge the liquid droplets from the nozzle opening.

Figure 11:
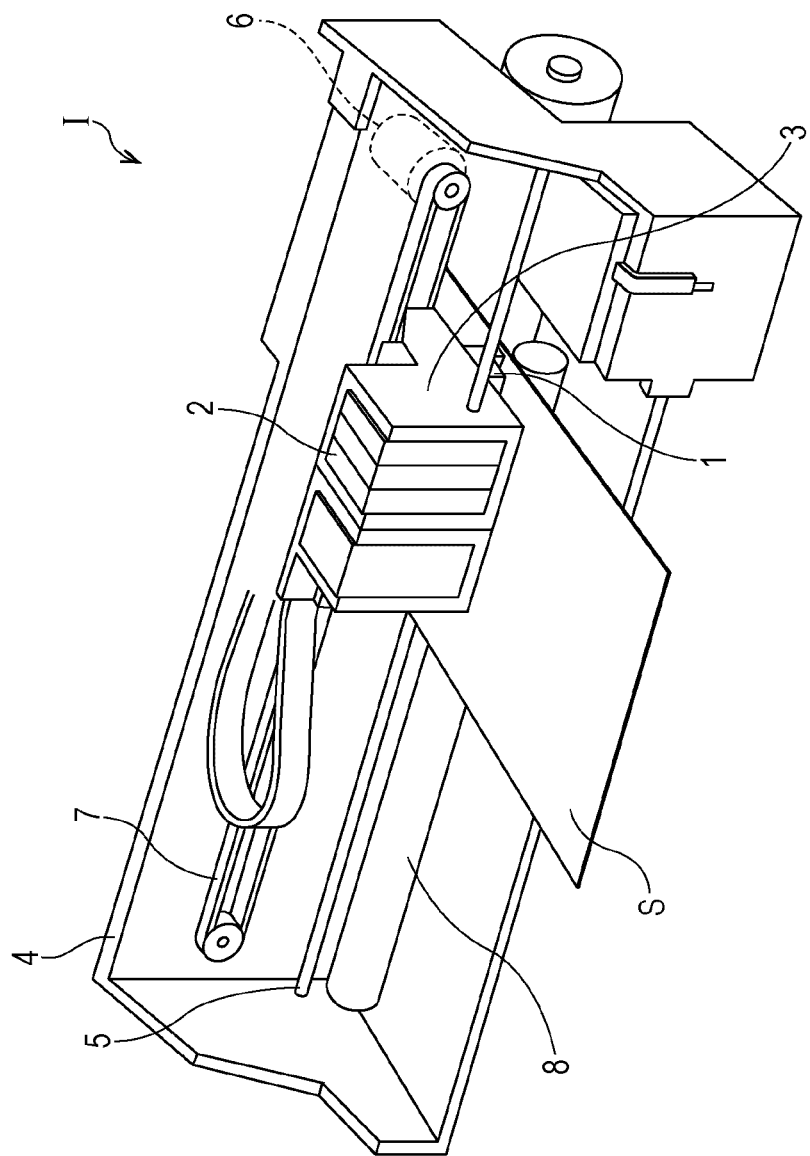
FIG. 11 is a view showing a schematic configuration of a recording apparatus according to an embodiment.

In addition, the ink jet type recording head 1 described above configures a portion of an ink jet type recording head unit having an ink flow path communicating with an ink cartridge or the like, and is mounted on an ink jet type recording apparatus. FIG. 11 is a schematic view showing an example of the ink jet type recording apparatus.

In the ink jet type recording apparatus I shown in FIG. 11, the plurality of recording heads 1 are detachably provided with an ink cartridges 2 constituting an ink supply unit, and a carriage 3 on which the recording head 1 is mounted is provided so as to be movable in the axial direction on a carriage shaft 5 attached to an apparatus main body 4.

The driving force of a drive motor 6 is transmitted to the carriage 3 through a plurality of gears (not shown) and a timing belt 7, so that the carriage 3 on which the recording head 1 is mounted is moved along the carriage shaft 5. On the other hand, the apparatus main body 4 is provided with a transport roller 8 as a transport unit, and a recording sheet S which is a recording medium such as paper is transported by the transport roller 8. The transport unit for transporting the recording sheet S is not limited to the transport roller, and may be a belt, a drum, or the like.

In the ink jet type recording apparatus I described above, the ink cartridge 2 as the ink supply unit is mounted on the carriage 3, but the invention is not particularly limited thereto. For example, the ink supply unit such as an ink tank may be fixed to the apparatus main body 4, and the ink supply unit and the recording head 1 may be connected via a supply tube such as a tube. In addition, the ink supply unit may not be mounted on the ink jet type recording apparatus.

In addition, in the ink jet type recording apparatus I described above, the recording head 1 is mounted on the carriage 3 and moves in the main scanning direction, but the invention is not limited thereto. For example, the invention can be applied to a so-called line type recording apparatus in which the recording head 1 is fixed and printing is performed by simply moving the recording sheet S such as paper in the sub-scanning direction.

Furthermore, the invention is broadly applied to liquid ejecting heads in general, and can be applied, for example, to a recording head such as various ink jet type recording heads used in an image recording apparatus such as a printer, a color material ejecting head used for manufacturing a color filter such as a liquid crystal display, an electrode material ejecting head used for forming an electrode of an organic EL display and an field emission display (FED), a bioorganic material ejecting head used for manufacturing biochip, and the like. In addition, although the ink jet type recording apparatus I is described as an example of a liquid ejecting apparatus, it can be used for the liquid ejecting apparatus using other liquid ejecting head described above.

In addition, the invention is not limited to the piezoelectric device used for the liquid ejecting head, and can also be applied to another piezoelectric device having a substrate on which recessed portions (first recessed portion, second recessed portion) are formed and a piezoelectric element provided on one side of the substrate via a vibration plate. Examples of other piezoelectric devices include an ultrasonic device such as an ultrasonic transmitter, an ultrasonic motor, a temperature-electric converter, a pressure-electric converter, a ferroelectric transistor, a piezoelectric transformer, a blocking filter of harmful ray such as infrared ray, an optical filter using a photonic crystal effect by quantum dot formation, a filter such as an optical filter utilizing optical interference of thin film, various sensors such as an infrared sensor, an ultrasonic sensor, a thermal sensor, a pressure sensor, a pyroelectric sensor, and a gyro sensor (angular velocity sensor), ferroelectric memory, and the like.

What is claimed is:

1. A liquid ejecting head comprising:
    a nozzle plate on which a first nozzle row formed along a first direction including a first nozzle ejecting a liquid and a second nozzle row formed along the first direction including a second nozzle ejecting a liquid are formed;
    a flow path forming substrate on which a first pressure generation chamber communicating with the first nozzle and a second pressure generation chamber communicating with the second nozzle are formed;
    a vibration plate that is formed on one surface side of the flow path forming substrate so as to overlap the flow path forming substrate when viewed along a second direction which is perpendicular to the first direction;
    a first piezoelectric element that is provided on the vibration plate at a position corresponding to the first pressure generation chamber;
    a second piezoelectric element that is provided on the vibration plate at a position corresponding to the second pressure generation chamber;
    a protective substrate that is bonded to the one surface side of the flow path forming substrate;
    a flow path member that is adhered to a side of the protective substrate opposite to the flow path forming substrate via an adhesive, and in which a first flow path communicating with the first pressure generation chamber and a second flow path communicating with the second pressure generation chamber are formed; and
    a drive circuit that is housed in a space formed at least partially by the protective substrate and the flow path member to drive the first piezoelectric element and the second piezoelectric element,
    wherein the space is placed between the first piezoelectric element and the second piezoelectric element in a third direction which intersects the first direction and the second direction, the space is formed so as to overlap the protective substrate when viewed along the third direction, and the space is placed between the flow path forming substrate and the flow path member in the second direction, and
    wherein the flow path member is provided with a hole portion which is open to a region facing the space in the second direction.

2. The liquid ejecting head according to claim 1, wherein the drive circuit is disposed in the space without being adhered to the flow path member.

3. The liquid ejecting head according to claim 1, wherein the hole portion is a recessed portion provided in the flow path member.

4. The liquid ejecting head according to claim 1, wherein the hole portion is a through-hole penetrating the flow path member in a lamination direction of the flow path member and the protective substrate.

5. The liquid ejecting head according to claim 1, wherein an end portion of a side wall of the hole portion is located outside the drive circuit.

6. The liquid ejecting head according to claim 1, wherein surface roughness of the side wall of the hole portion is larger than surface roughness of an adhesive surface to the protective substrate, to which the hole portion of the flow path member is open.

7. The liquid ejecting head according to claim 1, wherein the side wall of the hole portion is inclined so that an opening of the hole portion is widened toward the drive circuit with respect to the lamination direction of the flow path member and the protective substrate.

8. The liquid ejecting head according to claim 1, wherein a thickness of the drive circuit is thicker than that of the protective substrate.

9. The liquid ejecting head according to claim 1, Wherein, in the flow path member, a portion where the first flow path is formed and adhered to the protective substrate is integrated with a portion where the second flow path is formed and adhered to the protective substrate.

10. A liquid ejecting apparatus comprising:
the liquid ejecting head according to claim 1.
11. A liquid ejecting apparatus comprising:
the liquid ejecting head according to claim 2.
12. A liquid ejecting apparatus comprising:
the liquid ejecting head according to claim 3.
13. A liquid ejecting apparatus comprising:
the liquid ejecting head according to claim 4.
14. A liquid ejecting apparatus comprising:
the liquid ejecting head according to claim 5.
15. A liquid ejecting apparatus comprising:
the liquid ejecting head according to claim 6.
16. A liquid ejecting apparatus comprising:
the liquid ejecting head according to claim 7.
17. A liquid ejecting apparatus comprising:
the liquid ejecting head according to claim 8.
18. A liquid ejecting apparatus comprising:
the liquid ejecting head according to claim 9.
19. A piezoelectric device which is used in a liquid ejecting head, comprising:
   a flow path forming substrate on which a first recessed portion and a second recessed portion are formed;
   a vibration plate that is formed on one surface side of the flow path forming substrate so as to overlap the flow path forming substrate when viewed along a second direction;
   a first piezoelectric element that is provided on the vibration plate at a position corresponding to the first recessed portion;
   a second piezoelectric element that is provided on the vibration plate at a position corresponding to the second recessed portion;
   a protective substrate that is bonded to the one surface side of the flow path forming substrate;
   a flow path member that is adhered to a side of the protective substrate opposite to the flow path forming substrate via an adhesive, and in which a first flow path communicating with the first recessed portion and a second flow path communicating with the second recessed portion are formed; and
   a drive circuit that is mounted in a space formed at least partially by the protective substrate and the flow path member to drive the first piezoelectric element and the second piezoelectric element,
   wherein the space is placed between the first piezoelectric element and the second piezoelectric element in a third direction which intersects the second direction, the space is formed so as to overlap the protective substrate when viewed along the third direction, and the space is placed between the flow path forming substrate and the flow path member in the second direction, and
   wherein the flow path member is provided with a hole portion which is open to a region facing the space in the second direction.

* * * * *